United States Patent
Martrou et al.

(10) Patent No.: US 7,285,378 B2
(45) Date of Patent: Oct. 23, 2007

(54) JUXTAPOSED ISLAND MANUFACTURING METHOD BY MEANS OF SELF-ORGANISED DEPOSITION ON A SUBSTRATE AND STRUCTURE OBTAINED USING SAID METHOD

(75) Inventors: David Martrou, Sorgues (FR); Noël Magnea, Moivans (FR)

(73) Assignee: Commissariat a l'Energie Atomique (FR)

( * ) Notice: Subject to any disclaimer, the term of this patent is extended or adjusted under 35 U.S.C. 154(b) by 243 days.

(21) Appl. No.: 10/163,035

(22) Filed: Jun. 4, 2002

(65) Prior Publication Data

US 2003/0064570 A1    Apr. 3, 2003

(51) Int. Cl.
    G03F 7/00    (2006.01)
(52) U.S. Cl. .......................... 430/313; 430/322; 117/87
(58) Field of Classification Search ................ 430/322, 430/313, 311; 117/86, 87
    See application file for complete search history.

(56) References Cited

U.S. PATENT DOCUMENTS

| | | | | |
|---|---|---|---|---|
| 5,013,683 A | * | 5/1991 | Petroff et al. .................. | 117/86 |
| 5,054,030 A | | 10/1991 | Sakaki ......................... | 372/45 |
| 5,070,375 A | | 12/1991 | Sakai ........................... | 357/4 |
| 5,298,108 A | * | 3/1994 | Miller ......................... | 148/33.4 |
| 5,436,468 A | * | 7/1995 | Nakata et al. ................ | 257/15 |
| 5,543,354 A | * | 8/1996 | Richard et al. ............... | 117/89 |

FOREIGN PATENT DOCUMENTS

EP    0 427 905    1/1990
EP    0 370 403    5/1990

OTHER PUBLICATIONS

J.Tersoff et al.; "Step-Bunching Instability of Vicinal Surfaces Under Stress", Phys.Rev.Lett.;v 75 (1995),p. 2730-2733.*
Bucher et al; "Self-organized clusters and nano-sized islands on metal surfaces"; Magentism- Molecules to materials; Wiley-VCH; (2002); ch.6; pp. 211-251.*
Lauri Niisto: "Advanced thin films for electronics and opto-electronics by atomic layer epitaxy"; Trans. IEEE elec.dev. (2000); p. 33-42.*
Dapkus et al.; "Atomic layer epitaxy for the growth of heterostructures"; IEDM (1988); pp. 472-474.*
Martrou et al., "Equilibrium shape of steps and islands on polar CdTe(001) surface: application to the preparation of self organized templates for growth of nanostructures", 2000, Thin Solid Films, vol. 367, pp. 48-57.
Tsuchiya et al., "Tilted Superlattices and Quantum Well Wire Arrays", Aug. 28-30, 1989, Japanese Journal of Applied Physics, pp. 305-308.

* cited by examiner

*Primary Examiner*—Kathleen Duda
(74) *Attorney, Agent, or Firm*—Thelen Reid Brown Raysman & Steiner LLP

(57)    ABSTRACT

The invention relates to a structure composed of a substrate wherein a surface supports juxtaposed islands, characterized in that the islands rest on a periodic network of terraces composed of the intersection of two step networks, each terrace having a first dimension corresponding to the step width of one of the step networks and a second dimension corresponding to the step width of the other step network, each terrace supporting at least two islands formed of a different superimposition of monolayers wherein the composition is chosen between at least one first composition and one second composition.

10 Claims, 6 Drawing Sheets

JUXTAPOSED ISLAND MANUFACTURING METHOD BY MEANS OF SELF-ORGANISED DEPOSITION ON A SUBSTRATE AND STRUCTURE OBTAINED USING SAID METHOD

FIELD OF THE INVENTION

The present invention relates to a method to manufacture juxtaposed islands by means of self-organised deposition on a substrate. It also relates to a structure obtained using said method.

STATE OF THE RELATED ART

The manufacture of very small objects (frequently referred to as nanostructures or microstructures) composed of different materials and organised in space finds applications in electronics (to produce memory components with a very high degree of integration when the structures are of nanometric size) or in optics (when the structures are of micrometric size).

The American patent No. 4,591,889 discloses semiconductor systems comprising monolayer super-networks. These systems comprise periodic variations in composition in a direction parallel to the substrate surface and in a direction perpendicular to said surface. To produce these variations in composition, the substrate surface was machined into steps. The monolayers are obtained by epitaxial growth, said growth taking place via the step edges (or raisers) which serve as nucleation sites. Therefore, the growth does not take place from the surface of the steps but by lateral progression onto said surface, with no variation in height.

DESCRIPTION OF THE INVENTION

In order to manufacture very small objects, it is proposed according to the present invention to start with a substrate wherein a surface comprises not a series of steps as in the prior art mentioned above, but small-sized terraces.

The substrate may be made of crystalline or amorphous material. The islands may be composed of insulating, metal, semiconductor or amorphous materials.

Therefore, the invention relates to a method to manufacture juxtaposed islands by means of self-organised deposition on a substrate, comprising the following steps:

shaping of a surface of a substrate according to a periodic network of terraces composed of the intersection of two step networks, each terrace having a first dimension corresponding to the step width of one of the step networks and a second dimension corresponding to the step width of the other step network, depositions of material onto said shaped surface, the depositions of material being carried out by means of step edge progression, each progression covering each terrace partially, to successively form a superimposition of monolayers, the composition of the monolayers being chosen between at least one first composition and one second composition, characterised in that:

the shaping step of a surface of a substrate results in square terraces of identical size and the same height, the material deposition step onto said shaped surface consists of carrying out, for each terrace, at least one alternation of a first deposition of a first material onto a progression covering a portion of terrace corresponding to a fraction x of one dimension or side of the terrace, and of a second deposition of a second material on a progression covering the free remaining portion of the terrace corresponding to the fraction 1−x of the side of the terrace, with the result that each terrace supports one square island formed solely of monolayers of the first material and of a side equal to x times the side of the terrace, one square island formed solely of monolayers of the second material and of a side equal to (1−x) times the side of the terrace, and of two islands formed of an alternation of a monolayer of the first material and a monolayer of the second material.

The invention also relates to a method to manufacture juxtaposed islands by means of self-organised deposition on a substrate, comprising the following steps:

shaping of a surface of a substrate according to a periodic network of terraces composed of the intersection of two step networks, each terrace having a first dimension corresponding to the step width of one of the step networks and a second dimension corresponding to the step width of the other step network, depositions of material onto said shaped surface, the depositions of material being carried out by means of step edge progression, each progression covering each terrace partially, to successively form a superimposition of monolayers, the composition of the monolayers being chosen between at least one first composition and one second composition, characterised in that:

the shaping step of a surface of a substrate results in square terraces of identical size and the same height, the material deposition step onto said shaped surface consists of carrying out, for each terrace, at least one alternation of a first deposition of a first material onto a progression covering a portion of terrace corresponding to a fraction x of one dimension or side of the terrace, of a second deposition of a second material on a progression covering the free remaining portion of the terrace corresponding to the fraction y of the side of the terrace, and of a third deposition of a third material on a progression covering the remainder of said free remaining portion of the terrace corresponding to a fraction 1−x−y of the side of the terrace, with the result that each terrace supports one square island formed solely of monolayers of the first material and of a side equal to x times the side of the terrace, one square island formed solely of monolayers of the second material and of a side equal to y times the side of the terrace, one square island formed solely of monolayers of the third material and of a side equal to (1−x−y) times the side of the terrace, of two islands formed of an alternation of a monolayer of the first material and a monolayer of the second material, of two islands formed of an alternation of a monolayer of the first material and a monolayer of the third material, and of two islands formed of an alternation of a monolayer of the second material and a monolayer of the third material.

The shaping step may be carried out by means of an optical or electronic lithography followed by an etching operation. It may also be carried out using a crystalline substrate wherein the surface is offset with reference to a crystalline plane.

The invention also relates to a structure composed of a substrate wherein a surface supports juxtaposed islands, formed of a superimposition of monolayers, characterised in that the islands rest on a periodic network of terraces composed of the intersection of two step networks, each terrace having a first dimension corresponding to the step width of one of the step networks and a second dimension corresponding to the step width of the other step network, each terrace supporting at least two islands formed of a different superimposition of monolayers wherein the composition is chosen between at least one first composition and one second composition.

Advantageously, the terraces are of a shape chosen from a parallelepiped, rectangle, diamond and square.

According to a particular alternative embodiment, the structure is characterised in that, the terraces being of a square shape, identical dimensions and the same height, each terrace supports one square island formed solely of monolayers of a first material and of a side equal to a fraction x of one dimension or side of the terrace, one square island formed solely of monolayers of a second material and of a side equal to (1−x) times the side of the terrace, and of two islands formed of an alternation of a monolayer of the first material and a monolayer of the second material.

According to another particular alternative embodiment, the structure is characterised in that, the terraces being of a square shape, identical dimensions and the same height, each terrace supports one square island formed solely of monolayers of a first material and of a side equal to a fraction x of one dimension or side of the terrace, one square island formed solely of monolayers of a second material and of a side equal to y times the side of the terrace, one square island formed solely of monolayers of a third material and of a side equal to (1−x−y) times the side of the terrace, of two islands formed of an alternation of a monolayer of the first material and a monolayer of the second material, of two islands formed of an alternation of a monolayer of the first material and a monolayer of the third material, and of two islands formed of an alternation of a monolayer of the second material and a monolayer of the third material.

BRIEF DESCRIPTION OF FIGURES

The invention will be understood more clearly and other advantages and specificities will emerge upon reading the following description, given as a non-exhaustive example, with reference to the appended figures wherein.

DETAILED DESCRIPTION OF EMBODIMENTS OF THE INVENTION

Figure 1:
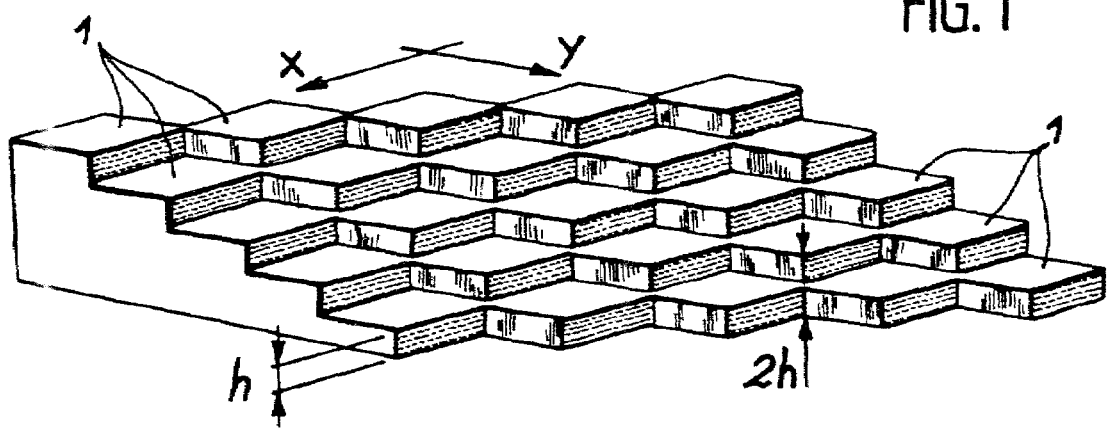
FIG. 1 is a schematic perspective representation of the surface of a substrate shaped in a periodic terrace network according to the invention.

FIG. 1 represents, schematically and in perspective, the surface of a substrate shaped in a periodic network of terraces according to the invention.

The surface of the substrate is shaped in a periodic terrace network (comprising spaces in top view) produced by the intersection of two networks of steps parallel to the directions of the X and Y plane. In the example shown, the steps all have the same height h. At the intersection of these two step networks, there are local zones with a skip of two steps of a height equal to 2 h. This double step network thus makes it possible to create terraces, referenced 1 in FIG. 1, wherein the shape depends on the X and Y directions.

Figure 2:
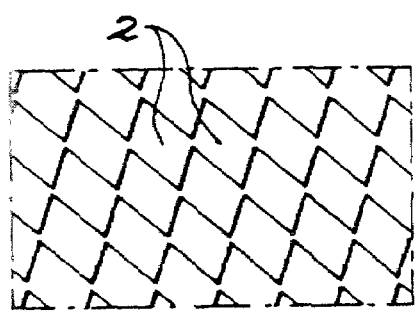
FIGS. 2 to 5 represent different shapes of terraces that can be used according to the present invention.
Figure 3:
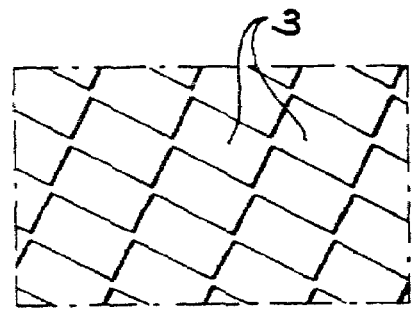
Figure 4:
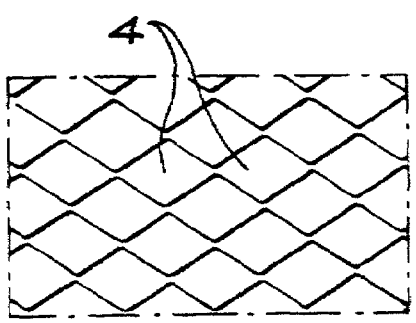
Figure 5:
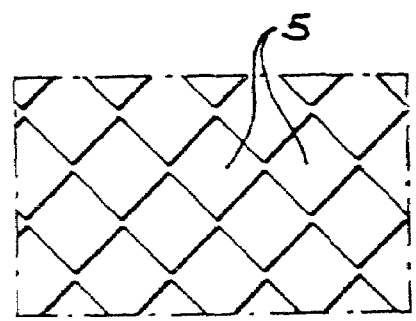

FIGS. 2 to 5 are top views of surfaces of substrates shaped according to the invention. FIG. 2 shows terraces (or spaces) 2 of any parallelepipedic shape. FIG. 3 shows rectangular shaped terraces 3. FIG. 4 shows diamond-shaped terraces 4. FIG. 5 shows square-shaped terraces 5, all of said terraces forming a check pattern.

The periodic network of the substrate may be obtained for example by optical or electronic lithography followed by an etching step. It may be obtained naturally using a crystalline substrate wherein the surface is offset with reference to a crystalline plane. A periodic network of atomic steps is then formed, organised in a geometric pattern defined by the angle between the natural direction of the steps and the offset direction. If this angle is equal to 45°, it is possible to obtain a check pattern.

The surface of the shaped substrate will receive material depositions. These depositions are obtained by growth produced by means of step edge progression. Therefore, the growth takes place horizontally, with no agglomerate and therefore no variation in height.

Figure 6:
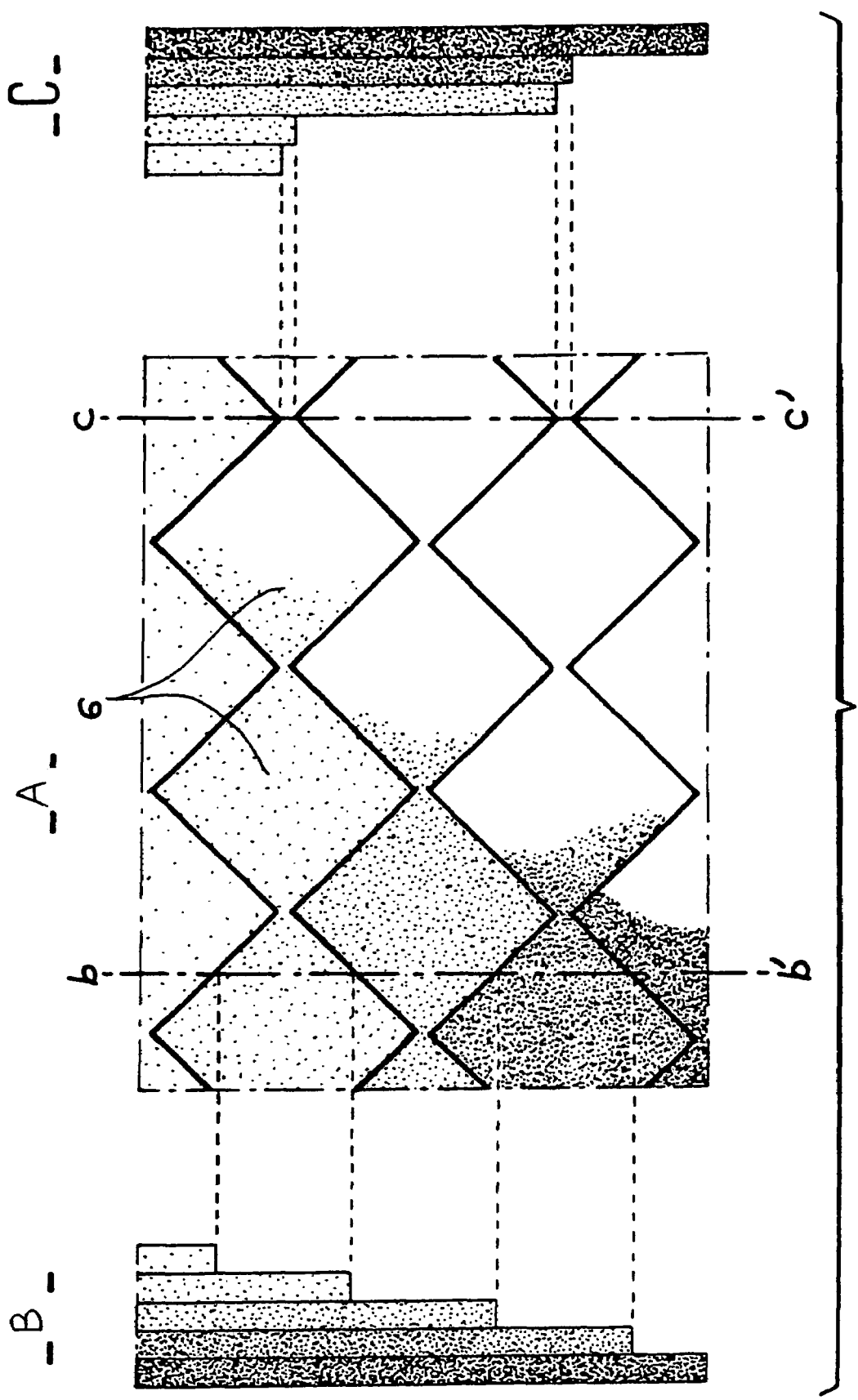
FIGS. 6, 7 and 8 illustrate the growth of two monolayers of different materials by means of step edge progression on the surface of a substrate shaped in a periodic network of square terraces, according to the invention.
Figure 7:
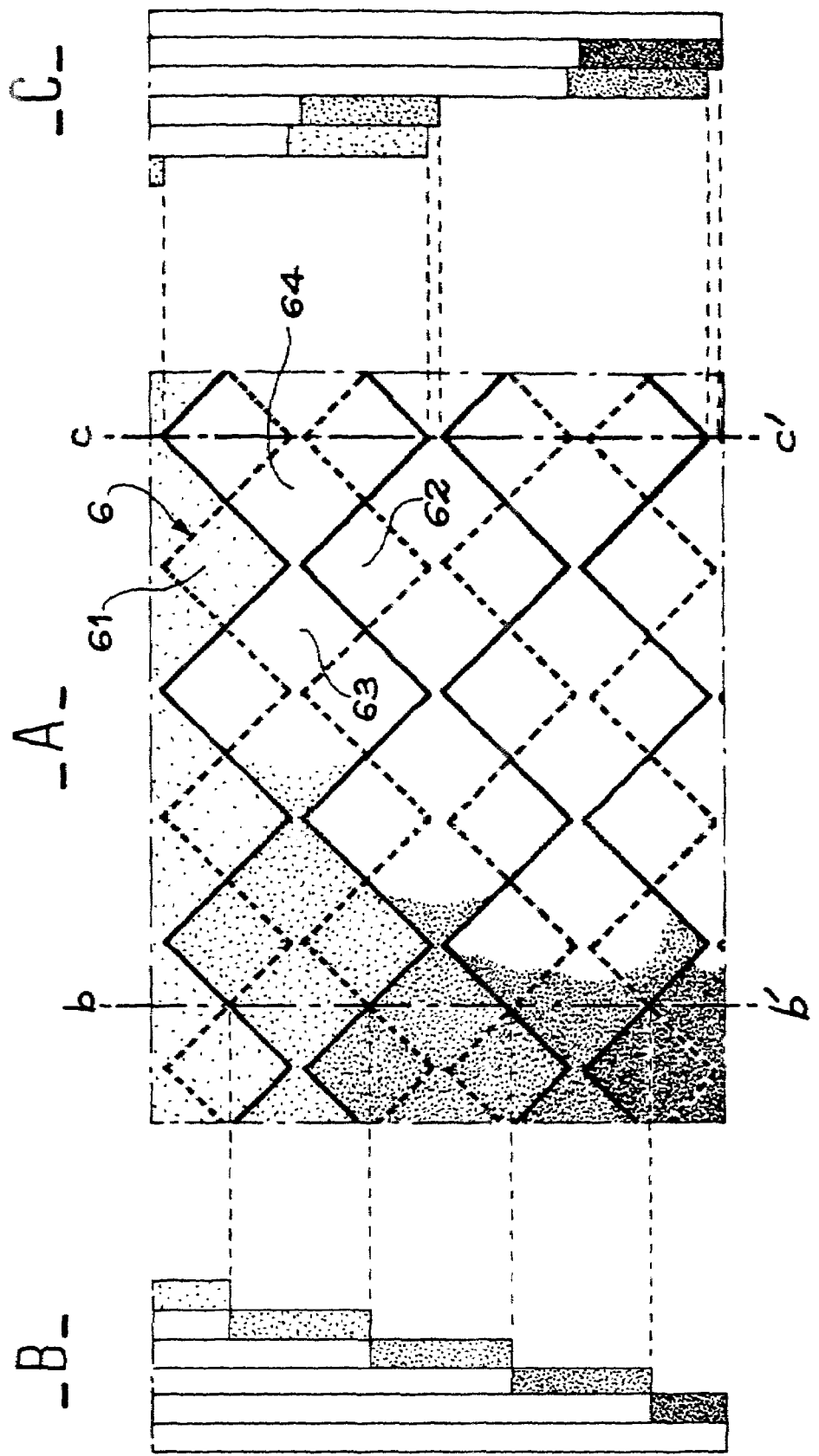
Figure 8:
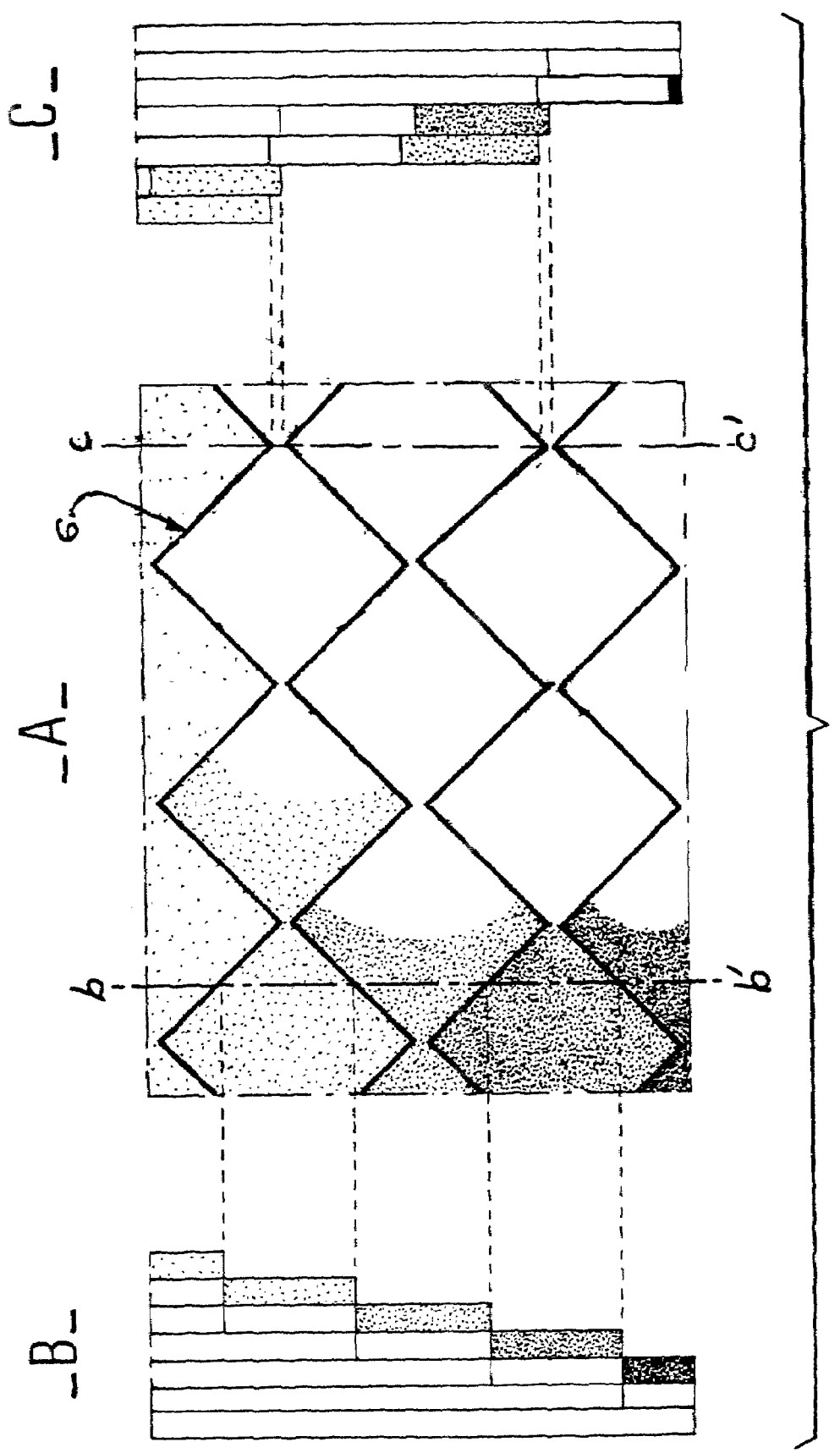
Figure 9:
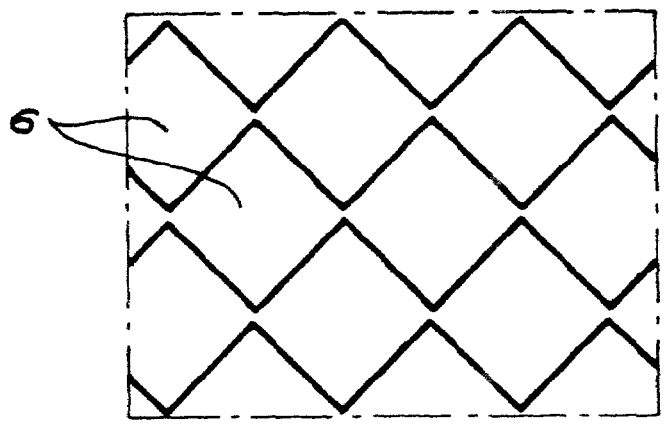
FIGS. 9, 10 and 11 are top views of the surface of the substrates represented respectively in FIGS. 6, 7 and 8, the composition of the different depositions being specified.
Figure 10:
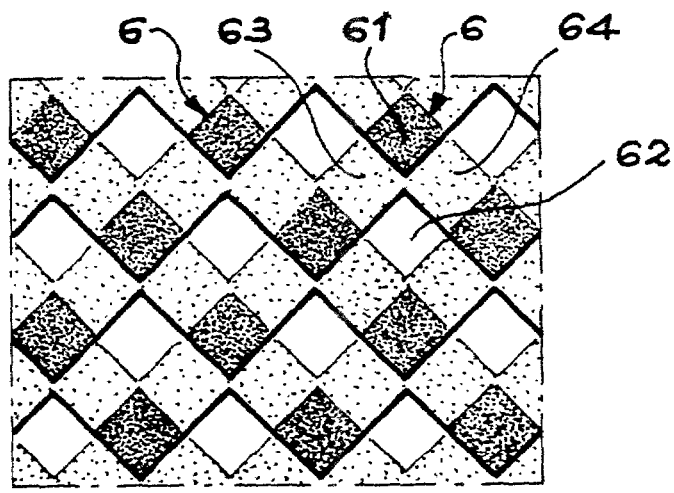
Figure 11:
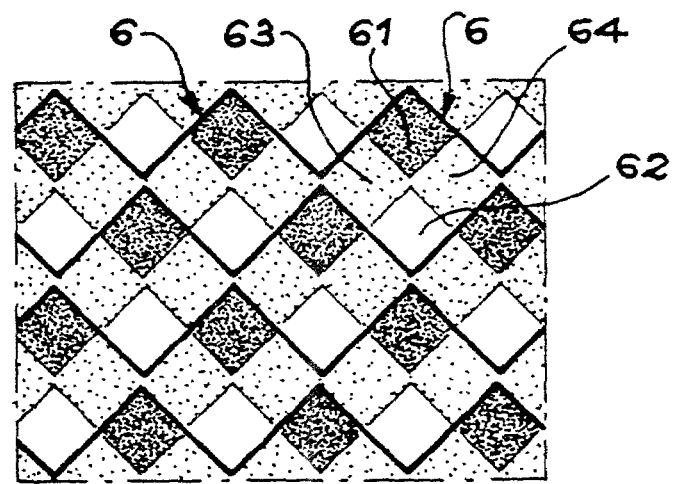

FIGS. 6, 7 and 8 illustrate the growth of two monolayers of different materials by means of step edge progression on the surface of a substrate shaped in a periodic network of square terraces of identical heights. FIGS. 9, 10 and 11 are top views of the surface of the substrates represented respectively in FIGS. 6, 7 and 8, the composition of the different depositions being specified.

FIGS. 6, 7 and 8 show in part A a top view of the terraces of the surface of a substrate, in part B a section along the axis bb' and in part C a section along the axis cc'.

FIG. 6 shows the surface of the shaped substrate before the deposition of material. This surface comprises square terraces 6 of identical heights. FIG. 9, associated with FIG. 6, shows the terraces 6 of this surface which are of the same chemical composition.

The growth is then produced via the step edge of a first monolayer of a compound A. The deposition is controlled so that the growth of the compound A induces a progression of material to the centre of the sides of the terraces. This first deposition induces the appearance of different zones for each terrace. This is shown in FIG. 7. An initial terrace 6, represented in dotted lines, is subdivided into a zone 61 located around the rising part of the steps, a zone 62 located around the falling part of the steps and two zones 63 and 64 located at an intermediate level. The zones 61, 62, 63 and 64 are each square in shape, of a side equal to half the side of a terrace 6. The zone 61 supports two superimposed monolayers of compound A. The zones 63 and 64 each support a single monolayer of compound A. The zone 62 is not coated. These zones 61 to 64 are also represented in FIG. 10 associated with FIG. 7.

The growth is then produced via the step edge of a second monolayer of a compound B. The deposition is controlled so that the growth of the compound B induces a progression of material corresponding to half of the sides of the terraces. The growth of the second monolayer, of compound B, completes the structure obtained previously such that the thickness of material deposited on each zone is equal to two monolayers. In this way, the zone 62, not coated previously, is now coated with two monolayers of compound B. The zones 63 and 64, each coated previously with a single monolayer of compound A, are also each coated with a monolayer of compound B. The zone 61 remains only coated with two monolayers of compound A. This is shown in FIG. 8 associated with FIG. 11.

By repeating these successive depositions, it is possible to form square-based columns only formed of compound A in contact via their sides with columns of combined A and B composition. The compound A columns are in contact via their edges with the compound B columns.

This deposition technique makes it possible to control the size of the islands by varying the quantity of compounds A and B deposited on the surface. It was seen above that progressions of compound A and compound B equal to half the sides of the terraces (square in shape) result in square islands (4 islands per terrace) of sides equal to half the side of a terrace.

It is possible to obtain islands of different sizes by means of material progression control. This is illustrated in FIGS. 12 and 13 which are top views of surfaces shaped so as to obtain square terraces of the same height.

Figure 12:
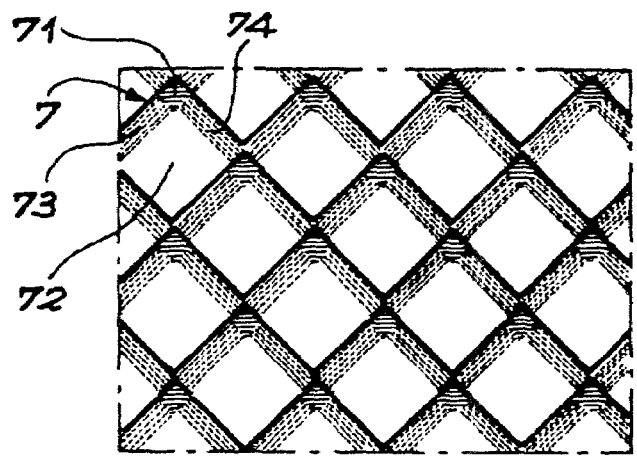
FIGS. 12 and 13 are top views of other surfaces of substrates on which two monolayers of different materials have been grown according to the invention.

The surface of the substrate shown in FIG. 12 comprises terraces 7 of side L. A first deposition, of compound A, is controlled to obtain a material progression over a distance $C_A=0.25 \times L$. An initial terrace 7 is then subdivided into a zone 71 located around the rising part of the steps, a zone 72 located around the falling part of the steps and two zones 73 and 74 located at an intermediate level. The zone 71 supports two superimposed monolayers of compound A. The zones 73 and 74 each support a single monolayer of compound A. The zone 73 is not coated.

A second deposition, of compound B, is carried out by step edge progression. It provides two monolayers of compound B on the zone 72, a single monolayer of compound B on the zones 73 and 74 and no deposition on the zone 71. This gives:
    one square zone 71, of side $C_A=0.25 \times L$, supporting two monolayers of compound A,
    one square zone 72, of side $C_B=0.75 \times L$, supporting two monolayers of compound B,
    rectangular zones 73 and 74, of width $C_A$ and length $C_B$, supporting one monolayer of compound A and one monolayer of compound B.

Figure 13:
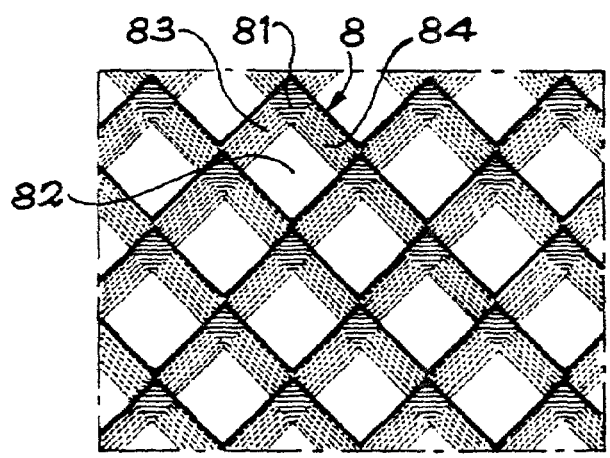

FIG. 13 shows a dimensional alternative embodiment comprising terraces 8 of side L. Using the same method as that described above, but for a first deposition, of compound A, providing a material progression over a distance $C_A=0.33 \times L$, this gives:
    one square zone 81, of side $C_A=0.33 \times L$, supporting two monolayers of compound A,
    one square zone 82, of side $C_B=0.67 \times L$, supporting two monolayers of compound B,
    two rectangular zones 83 and 84, of width $C_A$ and length $C_B$, supporting one monolayer of compound A and one monolayer of compound B.

As described above, these successive depositions may be repeated to obtain columns.

By depositing n different compounds, it is possible to subdivide a terrace into $n^2$ zones of variable sizes and defined composition. It is then possible to obtain, from these $n^2$ zones, n zones each composed of monolayers of the same material, the $(n^2-n)$ remaining zones comprising monolayers of different materials. This is shown in FIG. 14.

Figure 14:
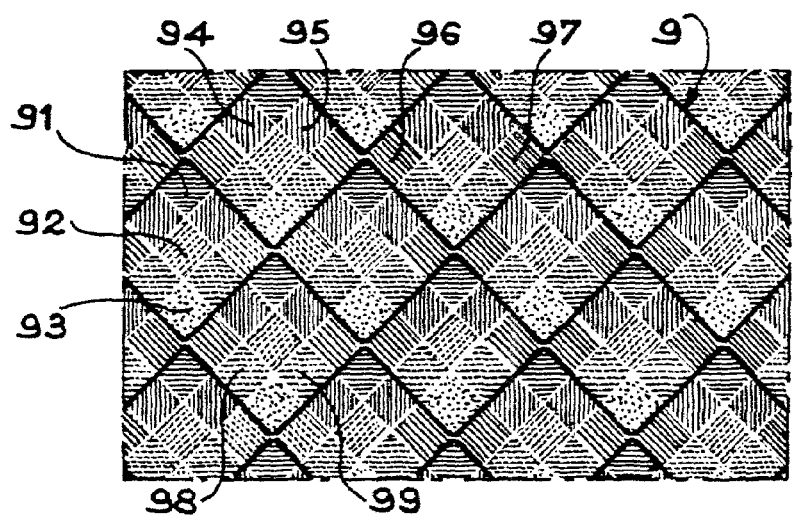
FIG. 14 is a top view of another surface of substrate on which three monolayers of different materials have been grown according to the invention.

FIG. 14 shows a top view of a surface of a substrate comprising square terraces 9, of identical sizes and the same height. By means of step edge progression over a distance representing ⅓ of the side L of a terrace, a compound A, a compound B and a compound C are deposited successively. This gives:
    one square zone 91 supporting two monolayers of compound A,
    one square zone 92 supporting two monolayers of compound B,
    one square zone 93 supporting two monolayers of compound C, the zones 91, 92 and 93 being aligned,
    two square zones 94 and 95 supporting one monolayer of compound A and one monolayer of compound B,
    two square zones 96 and 97 supporting one monolayer of compound A and one monolayer of compound C,
    two square zones 98 and 99 supporting one monolayer of compound B and one monolayer of compound C.

All these square zones comprise a side equal to ⅓ L.

As described above, these successive depositions may be repeated to obtain columns.

The invention claimed is:

1. Method to manufacture juxtaposed islands by means of self-organised deposition on a substrate, comprising the following steps:
    shaping of a surface of a substrate according to a periodic network of terraces composed of the intersection of two step networks, each terrace having a first dimension corresponding to the step width of one of the step networks and a second dimension corresponding to the step width of the other step network,
    depositions of material onto said shaped surface, the depositions of material being carried out by means of step edge progression, each progression covering each terrace partially, to successively form a superimposition of monolayers, the composition of the monolayers being chosen between at least one first composition and one second composition,
    characterized in that:
    the shaping step of a surface of a substrate results in square terraces of identical size and the same height,
    the material deposition step onto said shaped surface consists of carrying out, for each terrace, at least one alternation of a first deposition of a first material onto a progression covering a portion of terrace corresponding to a fraction x of one dimension or side of the terrace, and of a second deposition of a second material on a progression covering the free remaining portion of the terrace corresponding to the fraction 1−x of the side of the terrace, with the result that each terrace supports one square island formed solely of monolayers of the first material and of a side equal to x times the side of the terrace, one square island formed solely of monolayers of the second material and of a side equal to (1−x) times the side of the terrace, and of two islands formed of an alternation of a monolayer of the first material and a monolayer of the second material.

2. Method according to claim 1, characterized in that the shaping step is carried out by means of an optical or electronic lithography operation followed by an etching operation.

3. Method according to claim 1, characterized in that the shaping step is carried out using a crystalline substrate wherein the surface is offset with reference to a crystalline plane.

4. Method to manufacture juxtaposed islands by means of self-organised deposition on a substrate, comprising the following steps:
   shaping of a surface of a substrate according to a periodic network of terraces composed of the intersection of two step networks, each terrace having a first dimension corresponding to the step width of one of the step networks and a second dimension corresponding to the step width of the other step network,
   depositions of material onto said shaped surface, the depositions of material being carried out by means of step edge progression, each progression covering each terrace partially, to successively form a superimposition of monolayers, the composition of the monolayers being chosen between at least one first composition and one second composition,
   characterized in that:
   the shaping step of a surface of a substrate results in square terraces of identical size and the same height,
   the material deposition step onto said shaped surface consists of carrying out, for each terrace, at least one alternation of a first deposition of a first material onto a progression covering a portion of terrace corresponding to a fraction x of one dimension or side of the terrace, of a second deposition of a second material on a progression covering the free remaining portion of the terrace corresponding to the fraction y of the side of the terrace, and of a third deposition of a third material on a progression covering the remainder of said free remaining portion of the terrace corresponding to a fraction 1-x-y of the side of the terrace, with the result that each terrace supports one square island formed solely of monolayers of the first material and of a side equal to x times the side of the terrace, one square island formed solely of monolayers of the second material and of a side equal to y times the side of the terrace, one square island formed solely of monolayers of the third material and of a side equal to (1-x-y) times the side of the terrace, of two islands formed of an alternation of a monolayer of the first material and a monolayer of the second material, of two islands formed of an alternation of a monolayer of the first material and a monolayer of the third material, and of two islands formed of an alternation of a monolayer of the second material and a monolayer of the third material.

5. Method according to claim 4, characterized in that the shaping step is carried out by means of an optical or electronic lithography operation followed by an etching operation.

6. Method according to claim 4, characterized in that the shaping step is carried out using a crystalline substrate wherein the surface is offset with reference to a crystalline plane.

7. Structure composed of a substrate wherein a surface supports juxtaposed islands, formed of a superimposition of monolayers, characterized in that the islands rest on a periodic network of terraces composed of the intersection of two step networks, each terrace having a first dimension corresponding to the step width of one of the step networks and a second dimension corresponding to the step width of the other step network, each terrace supporting at least two islands formed of a different superimposition of monolayers wherein the composition is chosen between at least one first composition and one second composition.

8. Structure according to claim 7, characterized in that the terraces are of a shape chosen from a parallelepiped, rectangle, diamond and square.

9. Structure according to claim 7, characterized in that, the terraces being of a square shape, identical dimensions and the same height, each terrace supports one square island formed solely of mono layers of a first material and of a side equal to a fraction x of one dimension or side of the terrace, one square island formed solely of monolayers of a second material and of a side equal to (1-x) times the side of the terrace, and of two islands formed of an alternation of a monolayer of the first material and a monolayer of a second material.

10. Structure according to claim 7, characterized in that, the terraces being of a square shape, identical dimensions and the same height, each terrace supports one square island formed solely of monolayers of a first material and of a side equal to a fraction x of one dimension or side of the terrace, one square island formed solely of monolayers of a second material and of a side equal to a of the side of the terrace, one square island formed solely of monolayers of a third material and of a side equal to a fraction 1-x-y of the side of the terrace, of two islands formed of an alternation of a monolayer of the first material and a monolayer of the second material, of two islands formed of an alternation of a monolayer of the first material and a monolayer of the third material, and of two islands formed of an alternation of a monolayer of the second material and a monolayer of the third material.

* * * * *